(12) United States Patent
Tsai et al.

(10) Patent No.: US 9,484,338 B2
(45) Date of Patent: Nov. 1, 2016

(54) DIODE STRING IMPLEMENTATION FOR ELECTROSTATIC DISCHARGE PROTECTION

(71) Applicant: Taiwan Semiconductor Manufacturing Co., Ltd., Hsin-Chu (TW)

(72) Inventors: Tsung-Che Tsai, Hsinchu (TW); Jam-Wem Lee, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 44 days.

(21) Appl. No.: 14/049,239

(22) Filed: Oct. 9, 2013

(65) Prior Publication Data

US 2015/0097264 A1    Apr. 9, 2015

(51) Int. Cl.
| | |
|---|---|
| H01L 27/02 | (2006.01) |
| H02H 9/04 | (2006.01) |
| H01L 29/66 | (2006.01) |
| H01L 27/08 | (2006.01) |
| H01L 21/822 | (2006.01) |
| H01L 29/06 | (2006.01) |
| H01L 29/861 | (2006.01) |
| H01L 27/06 | (2006.01) |
| H01L 29/87 | (2006.01) |

(52) U.S. Cl.
CPC ......... *H01L 27/0255* (2013.01); *H01L 21/822* (2013.01); *H01L 27/0688* (2013.01); *H01L 27/0814* (2013.01); *H01L 29/0649* (2013.01); *H01L 29/6609* (2013.01); *H01L 29/66136* (2013.01); *H01L 29/8613* (2013.01); *H02H 9/046* (2013.01); *H01L 29/87* (2013.01)

(58) Field of Classification Search
CPC ........... H01L 27/0255; H01L 27/0814; H01L 29/6609; H01L 21/822; H01L 27/0688; H01L 29/8613; H02H 9/046; H02H 9/87
See application file for complete search history.

(56) References Cited

U.S. PATENT DOCUMENTS

| | | | |
|---|---|---|---|
| 8,461,035 B1 | 6/2013 | Cronquist et al. | |
| 8,665,570 B2* | 3/2014 | Jalilizeinali et al. | 361/56 |
| 2005/0280091 A1* | 12/2005 | Huang et al. | 257/355 |

OTHER PUBLICATIONS

Liu, C. et al., "A Design Tradeoff Study with Monolithic 3D Integration", 2012 13th International Symposium on Quality Electronic Design (ISQED), Mar. 2012, 8 pages.

* cited by examiner

*Primary Examiner* — Marc Armand
*Assistant Examiner* — Sue Tang
(74) *Attorney, Agent, or Firm* — Duane Morris LLP (57) ABSTRACT

A diode string having a plurality of diodes for ESD protection of a CMOS IC device comprises a first diode and a last diode in the diode string, wherein the first diode and the last diode are both formed on a bottom layer in a silicon substrate, and remaining diodes in the diode string. The remaining diodes are formed on a top layer placed on top of the bottom layer. The diode string further comprises a plurality of conductive lines that connect the first diode and the last diode on the bottom layer sequentially with the remaining diodes on the top layer to form a three dimensional (3D) structure of the diode string.

14 Claims, 7 Drawing Sheets

DIODE STRING IMPLEMENTATION FOR ELECTROSTATIC DISCHARGE PROTECTION

FIELD OF THE INVENTION

This disclosure relates to ElectroStatic Discharge (ESD) protection for integrated circuits and more particularly to series of connected diode strings employed for ESD protection.

BACKGROUND

As complementary metal-oxide-semiconductor (CMOS) technology progresses into the deep sub-micron scale, advanced processes use techniques such as thinner gate oxide, shorter channel length, shallower junction depth, LDD (Lightly-Doped Drain) structure, and/or salicide (Self-Aligned Silicide) diffusion. The use of these processes on the deep sub-micron scale leads to potential degradation of a CMOS IC device due to potential ElectroStatic Discharge (ESD) between high-voltage and low-voltage power supply lines of the CMOS IC device. In order to obtain suitable high resistance to damage from ESD, a CMOS IC device incorporates one or more ESD protection circuits.

A diode in the forward-biased condition can sustain a much higher ESD level than it can in the reverse-biased condition. Thus, a diode string that comprises a plurality of cascaded diodes connected in series is suitable to be used as an ESD protection circuit (e.g., ESD clamp) to clamp the ESD overstress voltage between the high-voltage and low-voltage power lines of the CMOS IC device and protect the device from high voltage stress.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1A:
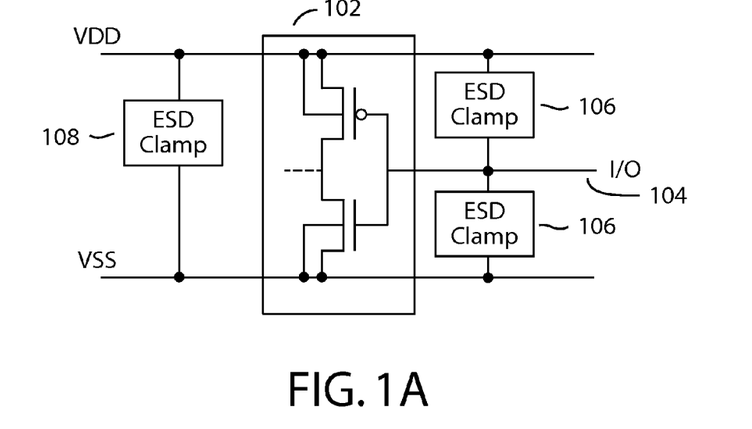
FIG. 1A is a schematic view of an example of a CMOS IC device protected by a plurality of ESD protection circuits.
Figure 1B:
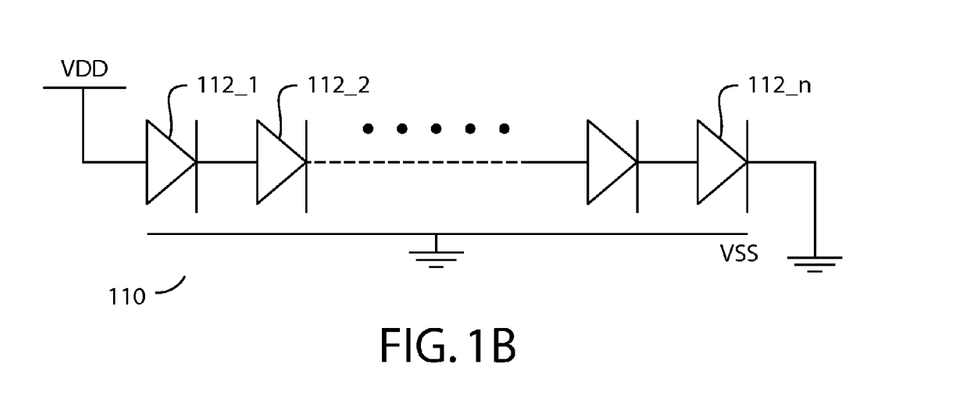
FIG. 1B shows schematic view of an example of a diode string 110 used to implement each of the ESD protection circuits shown in FIG. 1A.

FIG. 1B is a schematic diagram of a diode string 110. When coupled between the high-voltage and low-voltage power lines of a CMOS IC device, the diode string 110 acts as an ESD protection circuit, clamping the voltage across the power lines and protecting devices from high voltage stress. As a result, a parasitic Darlington amplifier is formed in the diode string by a plurality of connected devices, such as parasitic bipolar junction transistors (BJTs) or parasitic PNPs, resulting in constant substrate current leakage to a substrate, known as the Darlington effect. The leakage current may not only degrade the ESD current conduction ability of the diode string but may also cause unexpected latch-up issues on the chip. This substrate current leakage becomes more severe as operating temperature or the diode count in the diode string 110 increases.

The inventors have discovered that a novel implementation of a diode string utilizing the benefit of stacked CMOS three-dimensional (3D) processing reduces the unwanted parasitic leakage current in the diode string 110 used in the ESD protection circuit. For example, in some embodiments, intermediate diodes (other than the first and the last diodes) in the diode string are formed on an upper layer (e.g., the top layer or an intermediate layer) in a 3D IC structure, while the first and the last diodes in the diode string are placed on a bottom layer in the 3D IC structure. In some embodiments, the 3D IC structure is fabricated using a 3D process. The diodes that are structurally isolated on the upper (e.g., top) layer of the structure avoids unnecessary leakage current caused by parasitic PNPs. In addition, the first and the last diodes on the bottom layer provide a parasitic silicon-controlled rectifier (SCR), which can strengthen the current conduction ability on the bottom layer.

As referred to hereinafter, the 3D process is a 3D integration technology that fabricates an integrated semiconductor device including a plurality of layers/tiers of devices sequentially over a single silicon substrate, rather than fabricating two or more dies and bonding them together using bumps or through-silicon vias (TSVs). Each layer (tier) can include an active device layer and/or an interconnect structure having conductive line layers and conductive via layers. The 3D process enables ultra-fine-grained vertical integration of devices and interconnects on different layers by utilizing inter-layer-vias (ILVs) typically small in size (e.g., 50 nm in diameter) to connect the devices fabricated on different layers (tiers) from each other. The ILVs are also referred to as inter-tier vias (ITV).

FIG. 1A is a schematic view of an example of a CMOS IC device 102 protected by a plurality of ESD protection circuits 106, 108. As shown in FIG. 1A, CMOS IC device 102 incorporates ESD protection circuits 106 such as ESD clamps between every input/output (I/O) pin 104 of CMOS IC device 102 and its power lines $V_{DD}$ and $V_{SS}$, respectively, in order to obtain suitable high protection against damage from ESD. In some embodiments, ESD current may still pass through the internal circuits of CMOS IC device 102 via the I/O pins and/or the power lines (bypassing the input or output ESD protection clamp 106), in which case ESD damage can occur in the internal circuits of CMOS IC device 102. Thus, in some embodiments, a further ESD protection circuit 108 is further included between the power lines VDD and VSS in parallel with CMOS IC device 102. ESD protection circuit 108 discharges any ESD current to $V_{SS}$ without passing through the internal circuits of CMOS IC device 102, so that the internal circuits can be safely protected against any potential ESD damage.

FIG. 1B is a schematic view of an example of a diode string 110 used to implement each of the ESD protection circuits 106, 108 shown in FIG. 1A. As shown in FIG. 1B, diode string 110 includes a plurality of diodes 112_1, 112_2, . . . , 112_n connected in sequence between power rail $V_{DD}$ and ground rail $V_{SS}$ (e.g., ESD clamp 108 in FIG. 1A) or connected between an I/O pin 104 and one of the power lines Vdd, Vss (e.g., ESD clamps 106 in FIG. 1A). to clamp the ESD overstress voltage between the lines. In some embodiments, each diode 112 in FIG. 1B is formed as a PNP structure in N-wells as discussed in detail below.

Figure 2:
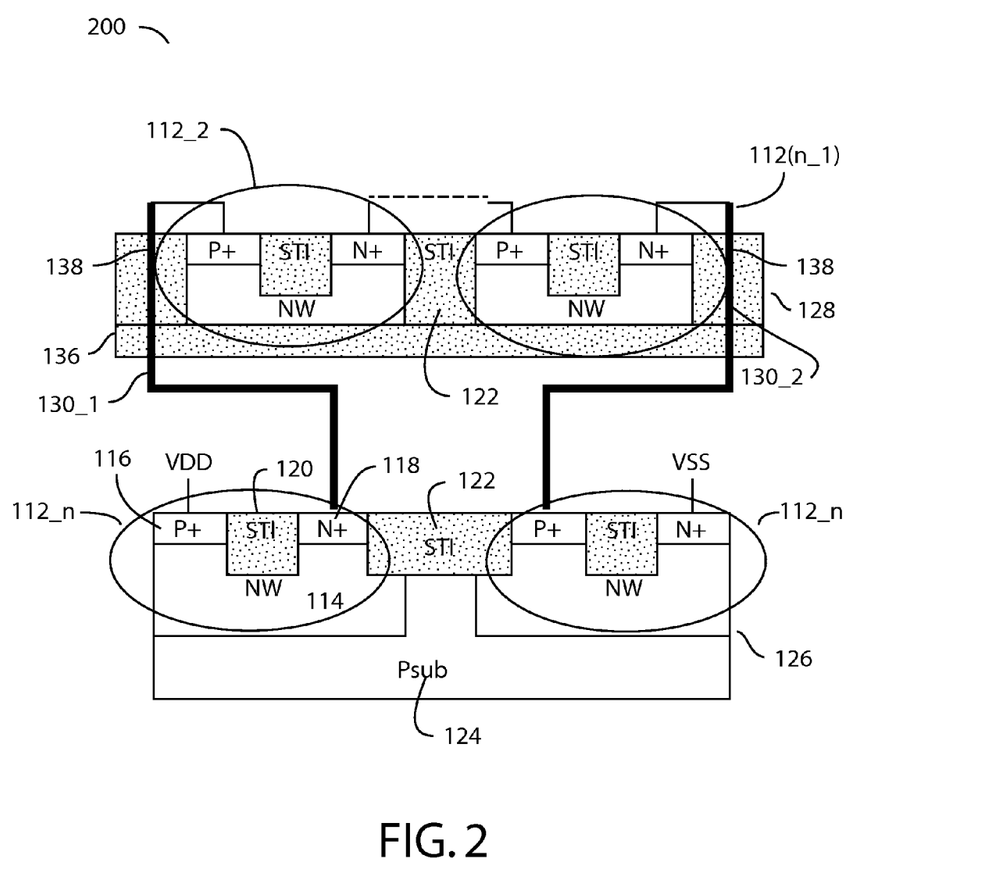
FIG. 2 is a cross section view of an example of a layout of diode string between power lines $V_{DD}$ and $V_{SS}$ implemented in a 3D structure using a stacked CMOS 3D process.

FIG. 2 is a cross section view of an example of a layout of the diode string 110 of ESD clamp 108 between power lines $V_{DD}$ and $V_{SS}$ implemented in a 3D structure 200 using a 3D process. In some embodiments, one or more additional inter-metal dielectric layers (not shown), including conductive line layers and/or local via layers, are provided between the layer 126 and the layer 128. As shown in FIG. 2, each diode 112_1, . . . 112_n is formed in an N-well 114 with P+ node 116 and N+ node 118 separated by shallow trench isolation (STI) region 120. In some embodiments, diodes 112 are separated from each other by STI region 122. In some embodiments, the first diode 112_1 and the last diode 112_n in diode string 110 of ESD clamp 108 are formed in P-substrate 124 on a bottom layer 126 of 3D structure 200 using the 3D process. The remaining diodes from 112_2 to 112_(n−1) are formed on a separate upper (e.g., top) layer 128 of 3D structure 200. The upper layer 128 can be formed over a dielectric layer 136 made of insulation material such as $SiO_2$, SiN, or $SiON_x$ with isolation regions 138 on the left and right sides of the diodes, respectively. The diodes (112_1 to 112_n) formed on the separate layers 126, 128 are connected together to form diode string 110 of ESD clamp 108 via conductive line 130, wherein conductive line 130 includes one or more metals, vias, through substrate vias (TSVs), or inter-layer vias (ILVs). As shown in FIG. 2, the N+ node of the first diode 112_1 is connected to the P+ node of the second diode 112_2 via conductive line 130_1, while the N+ node of the second to last diode 112_(n−1) is connected to the P+ node of the last diode 112_n via conductive line 130_2 to form complete diode string 110 of ESD clamp 108. In some embodiments, P+ node 116 of the first diode 112_1 is connected to the power rail $V_{DD}$ to serve as the anode for diode string 110, while N+ node 118 of the last diode 112_n is connected to the ground rail $V_{SS}$ to serve as the cathode for diode string 108. In the non-limiting example of FIG. 2, diode string 110 is connected between the two power lines Vdd, Vss. In other embodiments, the same diode string 110 can also be used to protect the I/O pins of CMOS IC device 102 (FIG. 1A) wherein the P+ node 116 of the first diode 112_1 or the N+ node 118 of the last diode 112_n is connected to an I/O pin to be protected, as shown in FIG. 1A.

Figure 3:
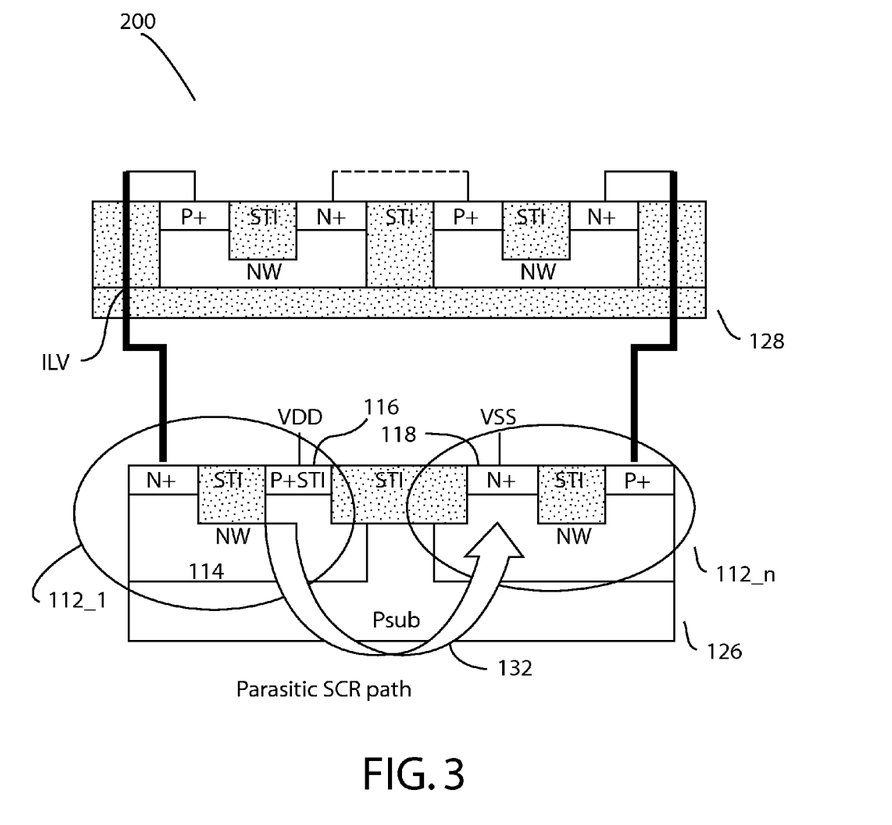
FIG. 3 is a cross section view of another example of a layout of a diode string between power lines $V_{DD}$ and $V_{SS}$, where the P+ node of the first diode and the N+ node of the last diode in the diode string are placed close to each other to form a parasitic SCR path.

In some embodiments, as shown in FIG. 3, the positions of the P+ node 116 and N+ node 118 of both the first diode 112_1 and the last diode 112_n are swapped, so that P+ node 116 of the first diode 112_1 serves as the anode of diode string 108 and is connected to $V_{DD}$. The P+ node 116 is placed adjacent to the N+ node 118 of the last diode 112_n. The N+ node 118 serves as the cathode of diode string 110 and is connected to $V_{SS}$ on the bottom layer 126. In this arrangement, a parasitic SCR path 132 is formed between the first diode 112_1 and the last diode 112_n on the bottom layer 126, wherein such parasitic SCR path embedded in diode string 110 may further enhance the current conduction ability on the bottom layer 126 of diode string 110. In some embodiments, one or more additional inter-metal dielectric layers (not shown), including conductive line layers and/or local via layers, are provided between the layer 126 and the layer 128.

Figure 4:
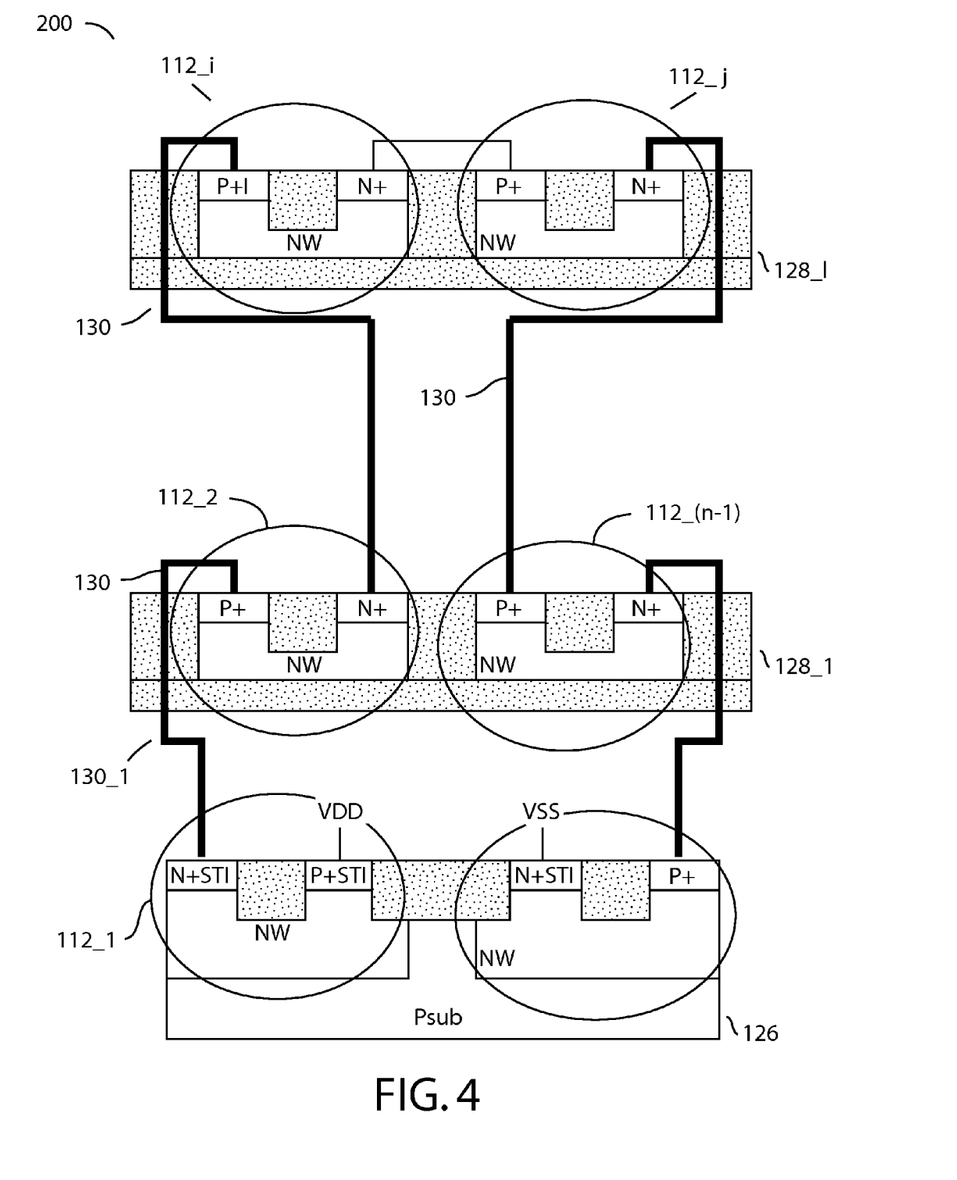
FIG. 4 is a cross section view of another example of a layout of a diode string between power lines $V_{DD}$ and $V_{SS}$, where a plurality of device layers are stacked on top of a bottom layer.

In some embodiments, diodes 112_2 through 112_(n−1) in diode string 110 can be placed on a plurality of device layers 128_1 through 128_k stacked on top of bottom layer 126 as shown by the cross sectional view of the layout of diode string 110 in FIG. 4. As shown in FIG. 4, the diodes 112_1 to 112_j placed on the plurality of device layers 128_1 through 128_k are connected with each other sequentially via a plurality of conductive lines 130 to form the diode string 110 without causing any performance degradation of the diode string 110. In various embodiments, the placement of diodes 112_1 to 112_(n−1) on the device layers 128_1 to 128_k can be determined according to a variety of design strategies adopted for the implementation of diode string 110. For example, the 3D IC can include any desired number of layers 128_1 to 128_k. For a given device having a given number of layers, 128_1 to 128_k, the intermediate diodes can be apportioned among the upper layers according to the designer's preference. In some embodiments, one or more additional inter-metal dielectric layers (not shown), including conductive line layers and/or local via layers, are provided between the layer 126 and the layer 128_1, or between any adjacent pair of upper layers 128_n−1, 128n.

Figure 5:
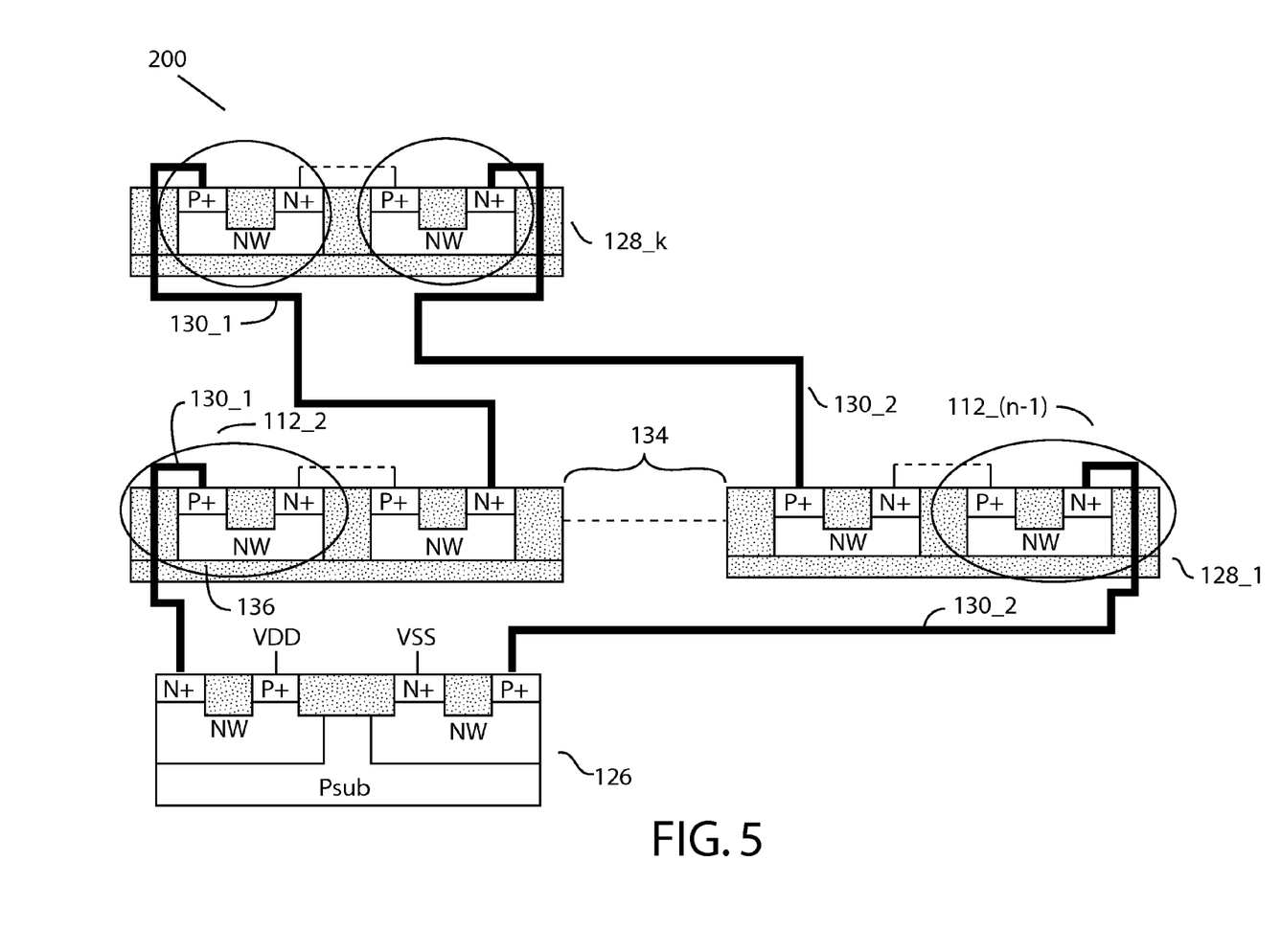
FIG. 5 is a cross section view of another example of a layout of diode string between power lines $V_{DD}$ and $V_{SS}$, where a plurality of pairs of diodes are placed on a device layer.

In some embodiments, more than one pair of diodes 112 can be placed on any of the device layers 128_1 through 128_k on top of bottom layer 126 as shown by the cross section view of the example of the layout of diode string 110 in FIG. 5. As shown in FIG. 5, multiple pairs of diodes 112 are placed on the same device layer 128_1. In some embodiments, free space 134 is made available on layer 128_1 between the pairs of diodes 112 for placement of other circuits and/or device components on the layer, according to the designer's choice. The diodes 112 so placed on layer 128_1 are connected to diodes placed on other layers via conductive lines 130 to form the diode string 110. In some embodiments, the upwards route 130_1 and the downwards route 130_2 of conductive lines 130 are routed independently from each other, which provides more flexibility for floorplanning, placement and routing of diode string 110. In some embodiments, one or more additional inter-metal dielectric layers (not shown), including conductive line layers and/or local via layers, are provided between the layer 126 and the layer 128_1, or between any adjacent pair of upper layers 128_n−1, 128n.

Figure 6:
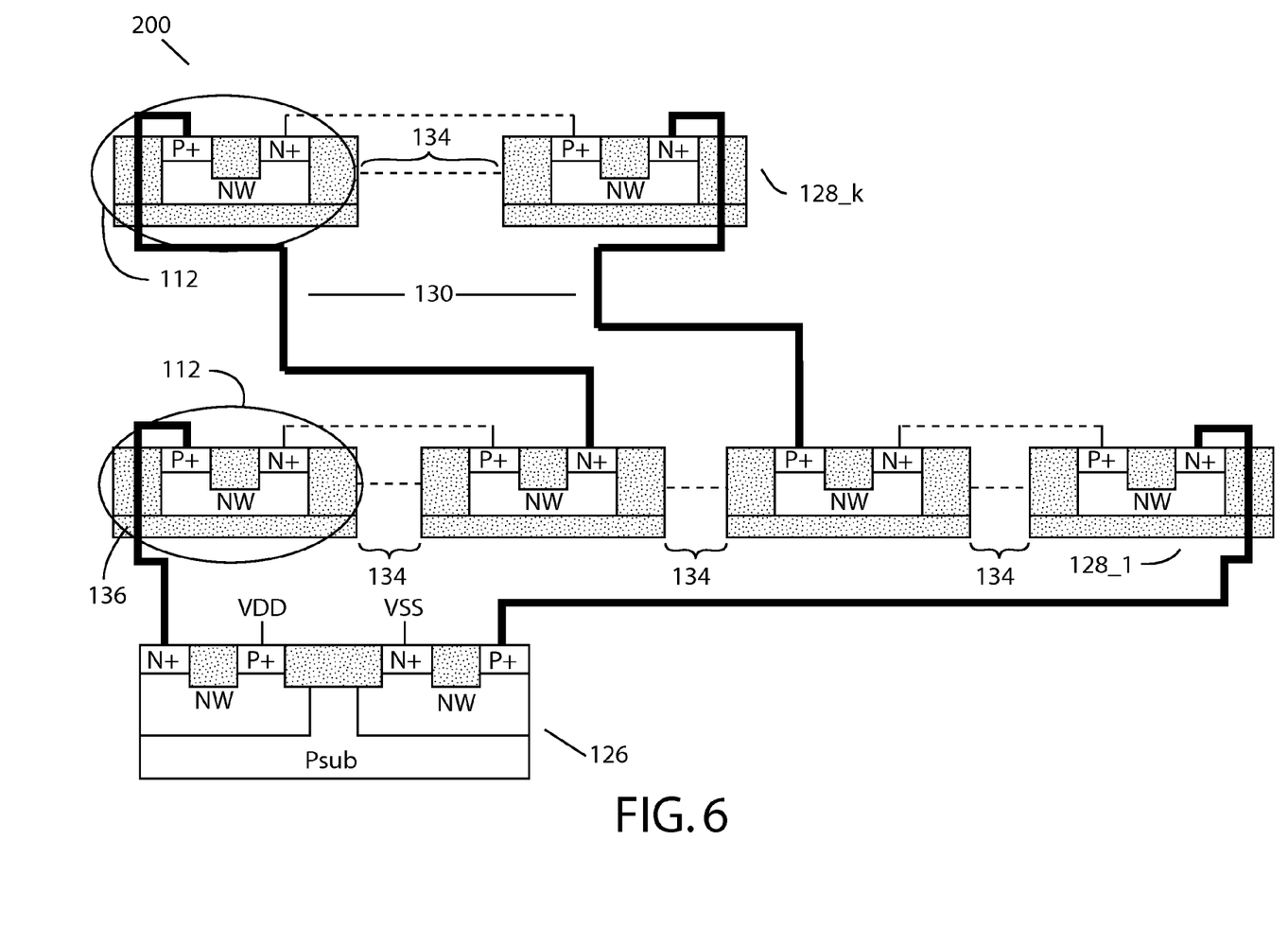
FIG. 6 is a cross section view of another example of a layout of diode string between power lines $V_{DD}$ and $V_{SS}$, where a plurality of diodes are each individually placed and separated from each other on a device layer.

In some embodiments, diodes 112 can each be individually placed and separated from each other on any combination of two or more of the upper device layers 128_1 to 128_k, leaving free space 134 available on a dielectric layer 136 for placement of other circuits and device components as shown by the cross section view of the layout of diode string 110 in FIG. 6. These individually placed diodes 112 are connected to other diodes on the same layer via intra layer metal connections (not shown) and to diodes on other layers via conductive lines 130 between the layers to form the diode string. The free space 134 provided by such 3D layouts of the diodes 112 provides ample flexibility for the implementation of diode string In some embodiments, one or more additional inter-metal dielectric layers (not shown), including conductive line layers and/or local via layers, are provided between the layer 126 and the layer 128_1, or between any adjacent pair of upper layers 128_n−1, 128n.

With the 3D layout structure of the diode string structure implemented using any of the 3D processes described above, unwanted parasitic leakage current is reduced or eliminated. This is because only the first and the last diodes in the diode string are placed on the bottom layer while the remaining diodes in the diode string are placed on other thin wafer device layers above, and isolated from, the bottom layer (which is embedded in a silicon substrate). In addition, the parasitic SCR path formed between the first and the last diodes of the diode string on the bottom layer can boost the ESD current conduction ability of the diode string 108, further protecting the CMOS IC device.

Figure 7:
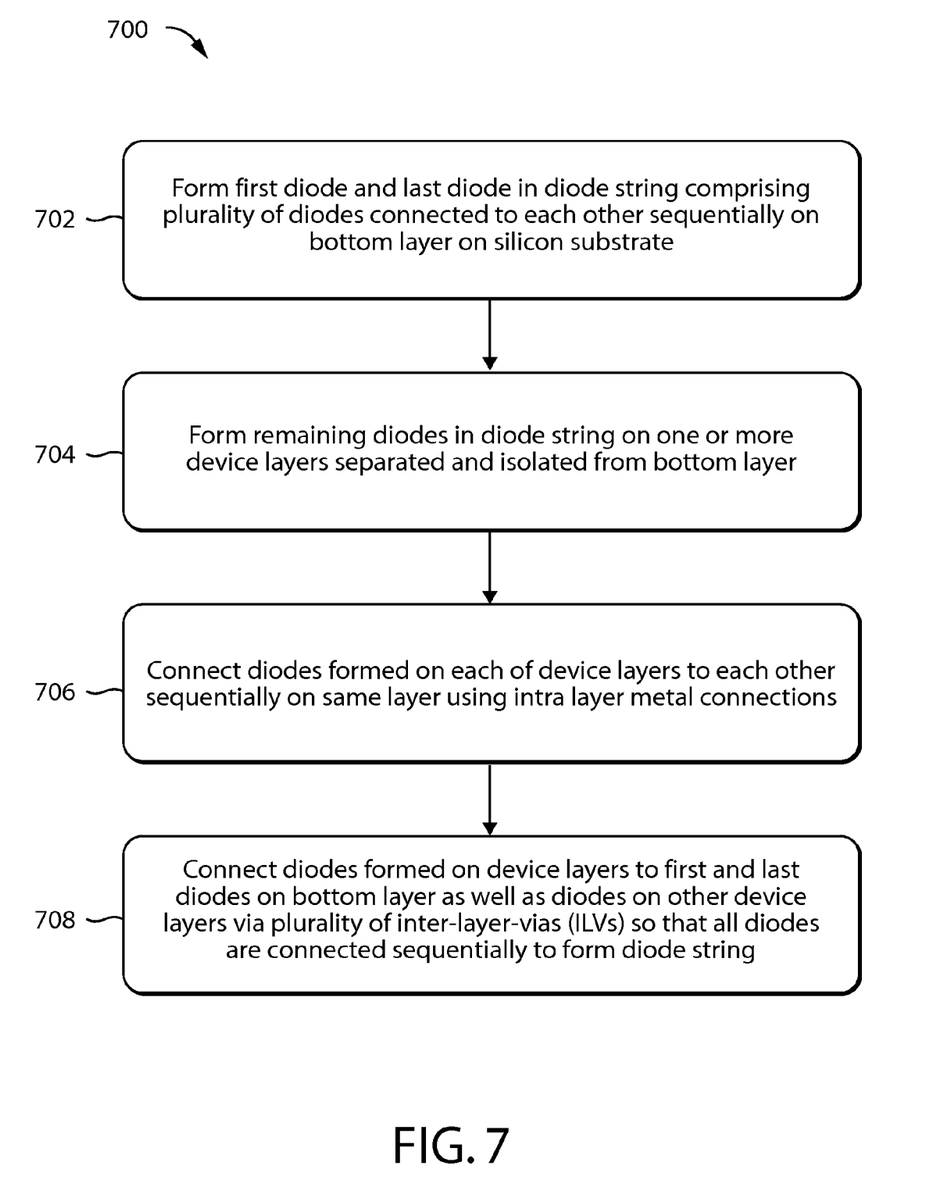
FIG. 7 is a flow chart of a method for implementing a diode string for ESD protection in a 3D structure using a stacked CMOS 3D process.

FIG. 7 is a flow chart 700 of a method for implementing a diode string in a 3D structure using 3D process for ESD protection.

At operation 702, a first diode and a last diode in a diode string comprising a plurality of diodes are formed on a bottom layer on a silicon substrate, such that the diodes are connected to each other sequentially.

At operation 704, the remaining diodes in the diode string are formed on one or more device layers separated and isolated from the bottom layer.

At operation 706, the diodes formed on each of the device layers are connected sequentially to each other diode on the same layer, using intra layer metal connections (including conductive lines and/or local vias).

At operation 708, the diodes formed on the upper device layers are connected to the first and the last diodes on the bottom layer as well as diodes on other device layers via a plurality of conductive lines, so that all the diodes of the diode string are connected sequentially, so as to form the diode string.

In some embodiments, a diode string having a plurality of diodes for ESD protection of a CMOS IC device comprises a first diode and a last diode in the diode string, wherein the first diode and the last diode are both formed on a bottom layer in a silicon substrate, and a plurality of remaining diodes in the diode string, wherein the remaining diodes are formed on at least one upper layer above the bottom layer. The diode string further comprises a plurality of conductive lines that connect the first diode and the last diode on the bottom layer sequentially with the remaining diodes on the at least one upper layer to form a three dimensional (3D) structure of the diode string.

In some embodiments, the upper layer is separated from the bottom layer.

In some embodiments, the upper layer is a thin semiconductor substrate layer.

In some embodiments, each diode in the diode string is formed in a N-well with a P+ node and a N+ node separated by a shallow trench isolation (STI) region In some embodiments, the P+ node of the first diode connects to power rail $V_{DD}$ to serve as an anode for the diode string and the N+ node of the last diode connects to ground rail Vss to serve as a cathode for the diode string.

In some embodiments, the P+ node of the first diode and the N+ node of the last diode are placed adjacent to each other to form a parasitic silicon-controlled rectifier (SCR) between the first diode and the last diode on the bottom layer.

In some embodiments, a diode string having a plurality of diodes for ESD protection of a CMOS IC device comprises a first diode and a last diode in the diode string, wherein the first diode and the last diode are both formed on a bottom layer in a silicon substrate, and a plurality of remaining diodes in the diode string, wherein the remaining diodes are formed on a plurality of device layers stacked above the bottom layer. The diode string further comprises a plurality of conductive lines that connect the first diode and the last diode on the bottom layer sequentially with the remaining diodes on the device layers to form a three dimensional (3D) structure of the diode string, wherein the P+ node of the first diode and the N+ node of the last diode are placed adjacent to each other to form a parasitic silicon-controlled rectifier (SCR) between the first diode and the last diode on the bottom layer.

In some embodiments, the bottom layer and the device layers are separated from each other by an interconnect structure comprising at least one conductive line layer or via layer.

In some embodiments, a subset of the plurality of remaining diodes are placed on at least one of the plurality of device layers and each of the subset of the plurality of remaining diodes is individually placed and separated from each other on the device layer.

In some embodiments, at least two of the plurality of diodes are separated from one another by a distance sufficiently large for placement of another active device or passive device therebetween.

In some embodiments, the plurality of remaining diodes are connected to each other via intra layer metal connections over the device layer and to diodes on other layers via the conductive lines between the layers.

In some embodiments, a method for forming a diode string for ESD protection of a CMOS IC device comprises forming a first diode and a last diode in the diode string comprising a plurality of diodes on a bottom layer on a silicon substrate and forming a plurality of remaining diodes in the diode string on one or more device layers stacked above the bottom layer. The method further comprises connecting the remaining diodes formed on each of the device layers to each other diode on the same layer sequentially using intra layer metal connections and connecting the remaining diodes formed on the device layers to the first and the last diodes on the bottom layer as well as to remaining diodes on other device layers using a plurality of conductive lines so that the first diode, the last diode and the remaining diodes are connected sequentially to form a three dimensional (3D) structure of the diode string.

In some embodiments, the bottom layer and the device layers are separated from each other by an interconnect structure comprising at least one conductive line layer or via layer.

In some embodiments, the method further comprises forming each diode in the diode string in an N-well with a P+ node and an N+ node separated by a shallow trench isolation (STI) region.

In some embodiments, the method further comprises connecting the P+ node of the first diode to power rail $V_{DD}$ to serve as an anode for the diode string and connecting the N+ node of the last diode to ground rail $V_{SS}$ to serve as a cathode for the diode string.

In some embodiments, the method further comprises providing the P+ node of the first diode and the N+ node of the last diode adjacent to each other to form a parasitic silicon-controlled rectifier (SCR) between the first diode and the last diode on the bottom layer.

In some embodiments, the method further comprises providing a subset of the plurality of remaining diodes on at least one of the plurality of device layers, wherein each of the subset of the plurality of remaining diodes is individually placed and separated from each other on the device layer.

In some embodiments, the method further comprises separating the plurality of diodes by a sufficient distance for placement of at least one other component between two of the plurality of diodes in the same one of the device layer or bottom layer.

In some embodiments, the method further comprises connecting the plurality of diodes to each other via intra layer metal connections on the layer.

In some embodiments, the method further comprises connecting ones of the plurality of diodes to others of the plurality of diodes on different ones of the bottom layer or device layers via the conductive lines.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A diode string having a plurality of diodes for ElectroStatic Discharge (ESD) protection of a CMOS IC device, comprising:
    a first diode and a last diode in the diode string, wherein the first diode and the last diode are both formed on a bottom layer in a silicon substrate, and wherein the first diode and the last diode are separated with a first shallow trench isolation (STI) region in the bottom layer;
    a plurality of remaining diodes in the diode string, wherein the remaining diodes are all formed on at least one upper layer above the bottom layer, wherein the plurality of the remaining diodes on the upper layer are structurally isolated from the first diode and the last diode on the bottom layer, and wherein any two adjacent diodes of the remaining diodes in the at least one upper layer are separated from each other with at least a second STI region in the upper layer; and
    a plurality of conductive lines that connect the first diode and the last diode on the bottom layer sequentially with the remaining diodes on the at least one upper layer to form a three dimensional (3D) structure of the diode string.

2. The diode string of claim 1, wherein:
    the upper layer is separated from the bottom layer.

3. The diode string of claim 1, wherein:
    the upper layer is a thin semiconductor substrate layer.

4. The diode string of claim 1, wherein:
    each diode in the diode string is formed in a N-well with a P+ node and a N+ node separated by a shallow trench isolation (STI) region.

5. The diode string of claim 4, wherein:
    the P+ node of the first diode connects to power rail $V_{DD}$ to serve as an anode for the diode string and the N+ node of the last diode connects to ground rail $V_{SS}$ to serve as a cathode for the diode string.

6. A diode string having a plurality of diodes for ElectroStatic Discharge (ESD) protection of a CMOS IC device, comprising:
    a first diode and a last diode in the diode string, wherein the first diode and the last diode are both formed on a bottom layer in a silicon substrate, and wherein the first diode and the last diode are separated with a first shallow trench isolation (STI) region in the bottom layer;
    a plurality of remaining diodes in the diode string, wherein the remaining diodes are formed on a plurality of device layers stacked above the bottom layer, and wherein any two adjacent diodes of the remaining diodes formed in one of the device layers are separated from each other with at least a second STI region in the one of the device layers; and
    a plurality of conductive lines that connect the first diode and the last diode on the bottom layer sequentially with the remaining diodes on the device layers to form a three dimensional (3D) structure of the diode string;
    wherein a P+ node of the first diode and an N+ node of the last diode are located adjacent to each other but separated with the first STI region so as to form a parasitic path between the first diode and the last diode.

7. The diode string of claim 6, wherein:
    the bottom layer and the device layers are separated from each other by an interconnect structure comprising at least one conductive line layer or via layer.

8. The diode string of claim 6, wherein:
    the plurality of remaining diodes are connected to each other via intra layer metal connections over the device layers and to diodes on other layers via the conductive lines between the layers.

9. A method for forming a diode string for ElectroStatic Discharge (ESD) protection of a CMOS IC device, comprising:
    forming a first diode and a last diode in the diode string comprising a plurality of diodes on a bottom layer on a silicon substrate, wherein the first diode and the last diode are separated with a first shallow trench isolation (STI) region in the bottom layer;
    forming all of a plurality of remaining diodes in the diode string on one or more device layers stacked above the bottom layer, wherein the plurality of the remaining diodes on the one or more device layers are structurally isolated from the first diode and the last diode on the bottom layer, and wherein any two adjacent diodes of the remaining diodes formed in one of the device layers are separated from each other with at least a second STI region in the one of the device layers;
    connecting the remaining diodes formed on each of the device layers to each of the remaining diodes in the diode string on the same layer sequentially using intra layer metal connections;
    connecting the remaining diodes formed on the one or more device layers to the first and the last diodes on the bottom layer as well as to remaining diodes on other device layers using a plurality of conductive lines so that the first diode, the last diode and the remaining diodes are connected sequentially to form a three dimensional (3D) structure of the diode string.

10. The method of claim 9, wherein:
    separating the bottom layer and the device layers are separated from each other by an interconnect structure comprising at least one conductive line layer or via layer.

11. The method of claim 9, further comprising:
    forming each diode in the diode string in an N-well with a P+ node and an N+ node separated by a shallow trench isolation (STI) region.

12. The method of claim 11, further comprising:
    connecting the P+ node of the first diode to power rail $V_{DD}$ to serve as an anode for the diode string and connecting the N+ node of the last diode to ground rail $V_{SS}$ to serve as a cathode for the diode string.

13. The method of claim 9, further comprising:
connecting the plurality of diodes to each other via intra layer metal connections on the layer.

14. The method of claim 9, further comprising:
connecting ones of the plurality of diodes to others of the plurality of diodes on different ones of the bottom layer or device layers via the conductive lines.

* * * * *